(12) United States Patent
Zhang et al.

(10) Patent No.: US 11,910,693 B2
(45) Date of Patent: Feb. 20, 2024

(54) DISPLAY DEVICE, DISPLAY PANEL AND MANUFACTURING METHOD THEREOF COMPRISING PATTERNING LIGHT-EMITTING LAYER IN OPENING REGION

(71) Applicant: BOE Technology Group Co., Ltd., Beijing (CN)

(72) Inventors: Ziyu Zhang, Beijing (CN); Chunyan Xie, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/871,067

(22) Filed: Jul. 22, 2022

(65) Prior Publication Data
US 2022/0359854 A1 Nov. 10, 2022

Related U.S. Application Data

(62) Division of application No. 16/923,213, filed on Jul. 8, 2020, now Pat. No. 11,450,839.

(30) Foreign Application Priority Data

Aug. 14, 2019 (CN) .......................... 201910750951.3

(51) Int. Cl.
*H10K 71/00* (2023.01)
*H10K 50/844* (2023.01)
(Continued)

(52) U.S. Cl.
CPC ........... *H10K 71/00* (2023.02); *H10K 50/844* (2023.02); *H10K 59/12* (2023.02); *H10K 59/1201* (2023.02); *H10K 71/231* (2023.02)

(58) Field of Classification Search
CPC ............. H01L 51/0017; H01L 51/0018; H01L 51/5253; H01L 51/5256; H01L 51/56;
(Continued)

(56) References Cited

U.S. PATENT DOCUMENTS

2015/0280172 A1  10/2015  Nishinohara et al.
2019/0051859 A1  2/2019  Choi et al.
(Continued)

FOREIGN PATENT DOCUMENTS

CN  104521323 A  4/2015
CN  108649133 A  10/2018
(Continued)

OTHER PUBLICATIONS

Requirement for Restriction/Election dated Mar. 14, 2022, for U.S. Appl. No. 16/923,213, filed Jul. 8, 2020, 7 pages.
(Continued)

*Primary Examiner* — Matthew E. Gordon
(74) *Attorney, Agent, or Firm* — XSENSUS LLP

(57) ABSTRACT

A display device, a display panel, and a manufacturing method thereof are provided. The display panel includes: a display substrate comprising a display region, wherein an opening region and an isolation region surrounding the opening region are arranged within the display region; a light-emitting layer formed on the display region; a blocking layer formed on a surface of the light-emitting layer away from the display substrate; and a first packaging layer covering the light-emitting layer and the blocking layer, wherein the first packaging layer is patterned through a photoresist layer to form a first through hole on the first packaging layer; a second through hole is respectively formed at a part of the blocking layer corresponding to the first through hole and at a part of the light-emitting layer corresponding to the first through hole.

11 Claims, 8 Drawing Sheets

(51) Int. Cl.
*H10K 59/12* (2023.01)
*H10K 71/20* (2023.01)

(58) Field of Classification Search
CPC ............. H01L 27/3225; H01L 27/3227; H01L 27/3234; H01L 27/3244; H01L 2227/323; H10K 71/00; H10K 71/231; H10K 71/40; H10K 71/421; H10K 71/441; H10K 59/12; H10K 59/1201; H10K 50/844
USPC .......................................................... 257/40
See application file for complete search history.

(56) References Cited

U.S. PATENT DOCUMENTS

| | | | |
|---|---|---|---|
| 2019/0157614 A1 | 5/2019 | Choi et al. | |
| 2020/0020752 A1 | 1/2020 | Shi et al. | |
| 2020/0212139 A1* | 7/2020 | Baek | H10K 50/11 |
| 2020/0401273 A1 | 12/2020 | Bang et al. | |
| 2021/0005683 A1 | 1/2021 | Sung et al. | |
| 2021/0005849 A1 | 1/2021 | Zhou et al. | |
| 2021/0359262 A1 | 11/2021 | Sun | |
| 2021/0408450 A1* | 12/2021 | Wang | H10K 77/10 |

FOREIGN PATENT DOCUMENTS

| | | |
|---|---|---|
| CN | 108666352 A | 10/2018 |
| CN | 109148525 A | 1/2019 |
| CN | 109273494 A | 1/2019 |
| CN | 109950296 A | 6/2019 |
| CN | 110120403 A | 8/2019 |
| WO | 2019/147012 A1 | 8/2019 |

OTHER PUBLICATIONS

Notice of Allowance dated May 18, 2022,, for U.S. Appl. No. 16/923,213, filed Jul. 8, 2020, 10 pages.
First Office Action dated Feb. 3, 2021, received for CN Application 201910750951.3, 12 pages including English Translation.
Notification to Grant Patent Right for Invention dated Jun. 8, 2021, received for CN Application 201910750951.3, 7 pages including English Translation.

* cited by examiner

DISPLAY DEVICE, DISPLAY PANEL AND MANUFACTURING METHOD THEREOF COMPRISING PATTERNING LIGHT-EMITTING LAYER IN OPENING REGION

CROSS-REFERENCE TO RELATED APPLICATIONS

This application is a Divisional Application of U.S. patent application Ser. No. 16/923,213, filed on Jul. 8, 2020 and is based on, and claims the benefit of priority to, Chinese Patent Application No. 201910750951.3, filed on Aug. 14, 2019, the entire contents of each are incorporated herein by reference.

TECHNICAL FIELD

This disclosure relates to the field of displaying technologies and, in particular to a display device, a display panel, and a manufacturing method of the display panel.

BACKGROUND

With the rapid development of display technology, the display performance of display panels is required to be higher and higher.

A display panel generally includes a display substrate and a light-emitting layer arranged on the display substrate. In a manufacturing process of the display panel, opening(s) is/are required to be formed on the display substrate and the light-emitting layer to install various components, such as a receiver, a camera, and a sensor. However, the light-emitting layer may be easily eroded during the opening process, thereby reducing the display performance of the display panel.

It should be noted that the information disclosed in the above "Background" section is merely intended to reinforce understanding of the background technology of the present disclosure and, accordingly, the Background may include information that does not constitute the prior art as already known by an ordinary person skilled in the art.

SUMMARY

An object of the present disclosure is to provide a display device, a display panel, and a manufacturing method of the display panel, so that a reduction in display performance of the display panel can be avoided.

According to an aspect of the present disclosure, a manufacturing method of a display panel is provided. The manufacturing method includes: providing a display substrate, wherein the display substrate comprises a display region, and an opening region and an isolation region surrounding the opening region are arranged within the display region; forming a light-emitting layer on the display region, wherein the light-emitting layer covers an overall area of the display region; forming a blocking layer on a surface of the light-emitting layer away from the display substrate, wherein an orthographic projection of the blocking layer on the display substrate covers an overall area of the opening region and at least a part of the isolation region; forming a first packaging layer covering the light-emitting layer and the blocking layer; forming a photoresist layer, and patterning the first packaging layer through the photoresist layer, to form a first through hole on the first packaging layer, wherein an orthographic projection of the first through hole on the display substrate is within a region of the orthographic projection of the blocking layer on the display substrate; removing the photoresist layer through a stripper; and removing a part of the blocking layer corresponding to the first through hole and a part of the light-emitting layer corresponding to the first through hole, to form a second through hole.

In one exemplary embodiment of the present disclosure, a material of the blocking layer includes an inorganic material.

In one exemplary embodiment of the present disclosure, the inorganic material includes a metallic material.

In one exemplary embodiment of the present disclosure, the metallic material includes one or more of aluminum, titanium, tin, copper, chromium, zinc, molybdenum.

In one exemplary embodiment of the present disclosure, removing a part of the blocking layer corresponding to the first through hole and a part of the light-emitting layer corresponding to the first through hole, comprises: etching the part of the blocking layer corresponding to the first through hole and the part of the light-emitting layer corresponding to the first through hole using an etching gas to form the second through hole, where the etching gas comprises one or more of chlorine, boron trichloride, and silicon tetrachloride.

In an exemplary embodiment of the disclosure, an orthographic projection of the first through hole on the display substrate covers the overall area of the opening region and at least a part of the isolation region, the manufacturing method further comprising: forming a second packaging layer covering the first packaging layer, wherein the second packaging layer covers an inner wall of the second through hole; and forming an opening in the opening region.

In one exemplary embodiment of the present disclosure, a thickness of the blocking layer is less than a thickness of the first packaging layer.

In one exemplary embodiment of the present disclosure, the blocking layer has a thickness of 20 nm to 2000 nm.

According to an aspect of the present disclosure, there is provided a display panel manufactured by the manufacturing method of a display panel according to any of the above embodiments.

In one exemplary embodiment of the present disclosure, the display panel includes a display substrate comprising a display region, wherein an opening region and an isolation region surrounding the opening region are arranged within the display region; a light-emitting layer formed on the display region; a blocking layer formed on a surface of the light-emitting layer away from the display substrate; and a first packaging layer covering the light-emitting layer and the blocking layer. The first packaging layer is patterned through a photoresist layer covering a side of the first packaging layer away from the display substrate to form a first through hole on the first packaging layer. A second through hole is respectively formed at a part of the blocking layer corresponding to the first through hole and at a part of the light-emitting layer corresponding to the first through hole. Before the second through hole is formed, the light-emitting layer covers an overall area of the display region, an orthographic projection of the blocking layer on the display substrate covers an overall area of the opening region and at least a part of the isolation region, and an orthographic projection of the first through hole on the display substrate is within a region of the orthographic projection of the blocking layer on the display substrate.

In one exemplary embodiment of the present disclosure, the display panel further includes a second packaging layer covering the first packaging layer and an inner wall of the second thought hole. An opening is formed in the opening region.

According to an aspect of the present disclosure, there is provided a display device including the display panel of any of the above embodiments.

According to the display device, the display panel and the manufacturing method of the display panel, the blocking layer is formed on a surface of the light-emitting layer away from the display substrate, an orthographic projection of the blocking layer on the display substrate covers an overall area of the opening region and at least a part of the isolation region, and the projection of the first through hole on the display substrate is within the projection of the blocking layer on the display substrate, so that the light-emitting layer may be isolated from stripper for removing photoresist by the blocking layer, thereby avoiding substances such as water and organic solvents in the stripper from eroding the light-emitting layer, and thus avoiding a reduction of the display performance.

It should be understood that both the foregoing general description and the following detailed description are exemplary and explanatory only and are not restrictive of the disclosure.

BRIEF DESCRIPTION OF THE DRAWINGS

The above-described and other features and advantages of the present disclosure will become more apparent from the detailed descriptions of exemplary embodiments with reference with the accompanying drawings. It is understood that the drawings in the following description are merely examples of this disclosure, and that other drawings may be obtained by those ordinary skilled in the art without creative work.

DETAILED DESCRIPTION

Figure 1:
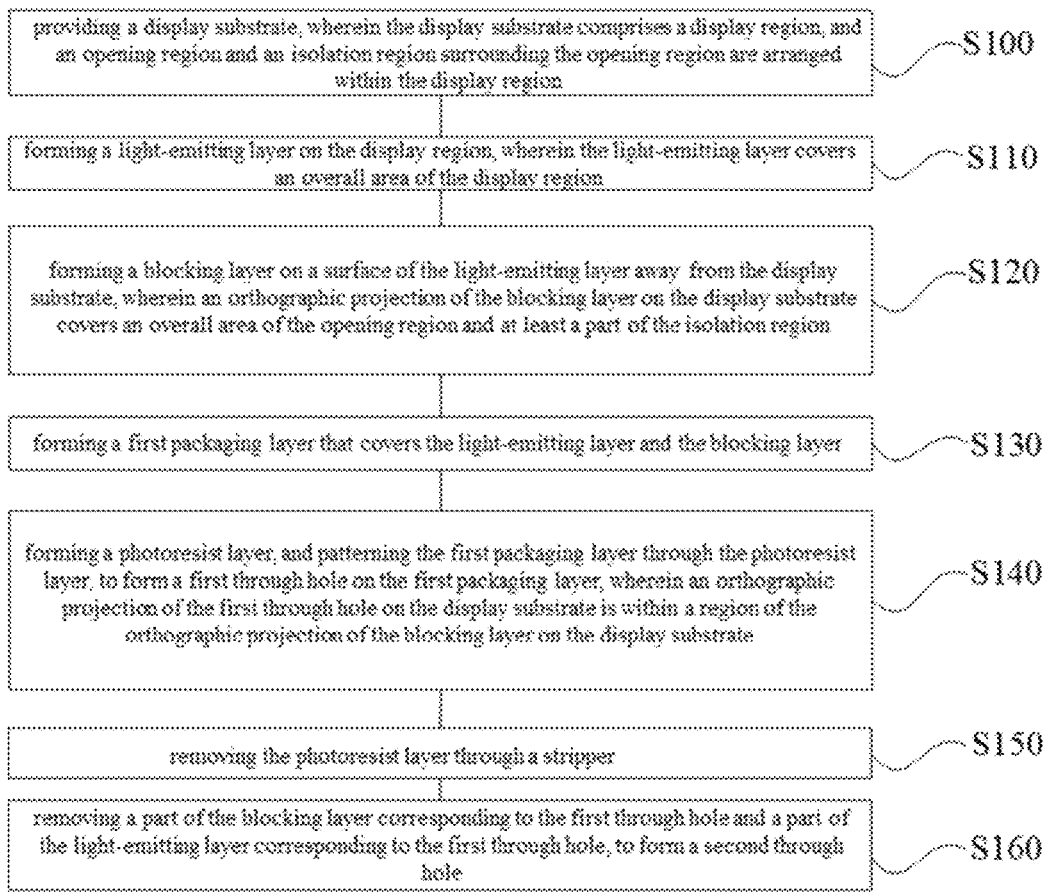
FIG. 1 is a flowchart of a manufacturing method of a display panel according to an embodiment of the present disclosure.

Now, the exemplary embodiments will be described more fully with reference to the accompanying drawings. However, the exemplary embodiments can be embodied in a variety of forms and should not be construed as limiting the embodiments set forth herein. Instead, these embodiments are provided so that the present disclosure will be thorough and complete, and the concepts of the exemplary embodiments will be fully given to those skilled in the art. The features, structures, or characteristics described herein may be combined in one or more embodiments in any suitable manner. In the following description, numerous specific details are provided to fully understand the embodiments of the present disclosure. However, those skilled in the art will recognize that the technical solutions of the present disclosure may be practiced without one or more of the specific details, or other components, steps and so on may be used. In other cases, the well-known technical solutions are not shown or described in detail to avoid obscuring various aspects of the present disclosure. The same reference numerals denote the same or similar structures in the drawings, and thus their detailed descriptions will be omitted.

In addition, the drawings are merely schematic illustrations of the present disclosure, and are not necessarily drawn to scale. The same reference numerals denote the same or similar structures in the drawings, and thus their detailed descriptions will be omitted. The terms "a," "an," "the," "said," and "at least one" are used to express the presence of one or more the element, constituents, or the like. The terms "comprise," "include," and "have" are intended to be inclusive, and mean there may be additional elements, constituents, or the like other than the listed elements, constituents, or the like.

An embodiment of the present disclosure provides a manufacturing method of a display panel. As shown in FIG. 1, the manufacturing method of the display panel may include steps of S100 to S160:

S100, providing a display substrate, where the display substrate comprises a display region, and where an opening region and an isolation region surrounding the opening region are arranged within the display region;

S110, forming a light-emitting layer on the display region, where the light-emitting layer covers an overall area of the display region;

S120, forming a blocking layer on a surface of the light-emitting layer away from the display substrate, where an orthographic projection of the blocking layer on the display substrate covers an overall area of the opening region and at least a part of the isolation region;

S130, forming a first packaging layer that covers the light-emitting layer and the blocking layer;

S140, forming a photoresist layer and patterning the first packaging layer through the photoresist layer to form a first through hole on the first packaging layer, where an orthographic projection of the first through hole on the display substrate is within a region of the orthographic projection of the blocking layer on the display substrate;

S150, removing the photoresist layer through a stripper; and

S160, removing a part of the blocking layer corresponding to the first through hole and a part of the light-emitting layer corresponding to the first through hole, to form a second through hole.

According to the display device, the display panel, and the manufacturing method of the display panel, the blocking layer is formed on a surface of the light-emitting layer away from the display substrate, an orthographic projection of the blocking layer on the display substrate covers the overall area of the opening region and at least the part of the isolation region, and the projection of the first through hole on the display substrate is within the projection of the blocking layer on the display substrate so that the light-emitting layer may be isolated from the stripper for removing photoresist by the blocking layer, thereby avoiding substances, such as water and organic solvents, in the stripper from eroding the light-emitting layer, and further avoiding reduction of the display performance.

The steps of the manufacturing method of the display panel according to the embodiments of the present disclosure will be described in detail below.

In S100, a display substrate is provided, where the display substrate includes a display region, and where an opening region and an isolation region surrounding the opening region are arranged within the display region.

Figure 3:
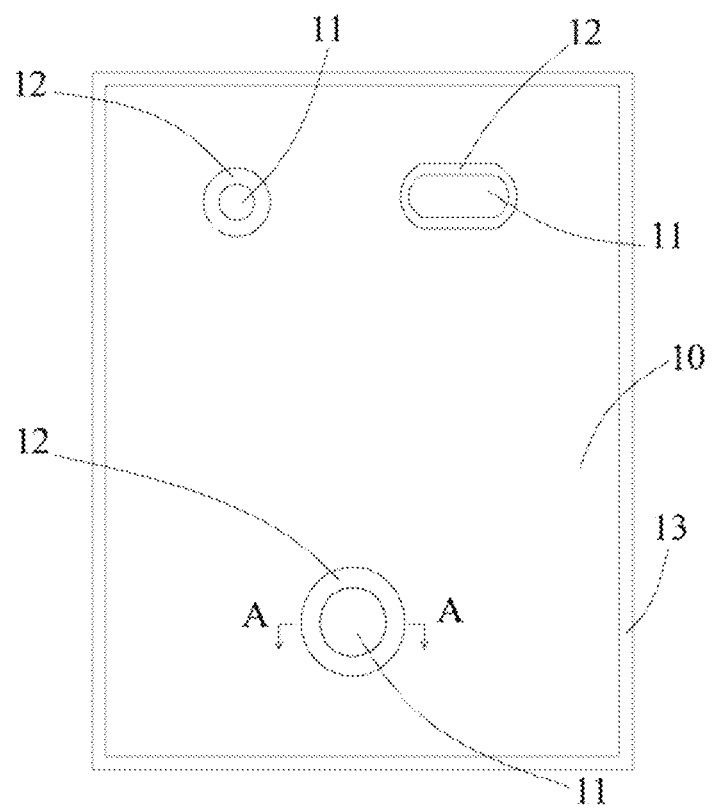
FIG. 3 is a schematic view of a display substrate according to an embodiment of the present disclosure.
Figure 4:
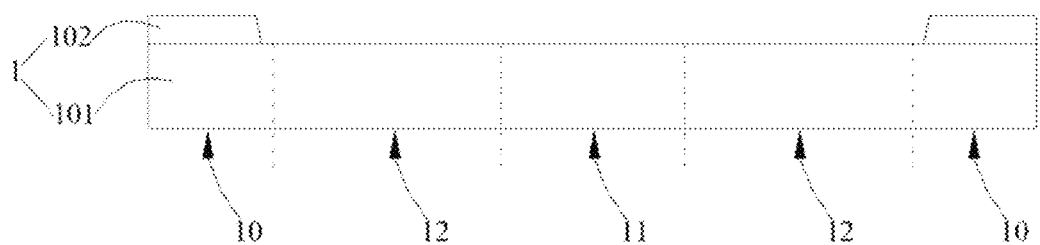
FIG. 4 is a cross-sectional view in a direction A-A of the structure shown in FIG. 3.

As shown in FIG. 3 and FIG. 4, the display substrate 1 may include a base 101 and a thin film transistor 102 formed on the base 101. The display region 10 may be rectangular or the like. The opening region 11 may be circular, and of course, may have other shapes. The number of the opening region 11 may be one, two or three, but it not limited thereto. The isolation region 12 may be annular and surround the opening region 11, and the isolation region 12 and the opening region 11 form a continuous inner non-display region. For example, the display region 10 is rectangular, the opening region 11 is circular, and the isolation region 12 is circular and is disposed at the periphery of the opening region 11. In addition, a peripheral region 13 may be provided on the periphery of the display region 10.

In S110, a light-emitting layer is formed on the display region, and the light-emitting layer covers the overall area of the display region.

Figure 5:
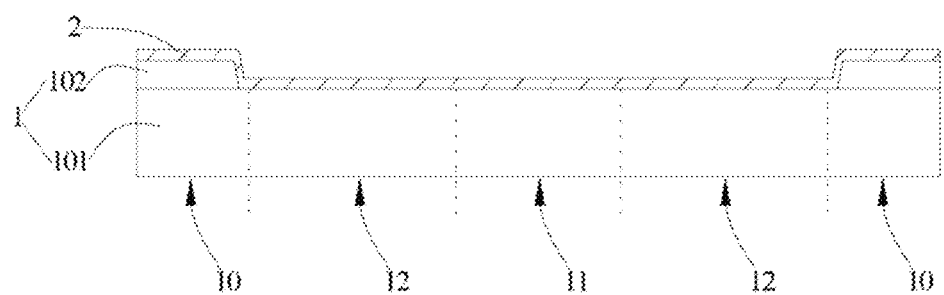
FIG. 5 is a schematic view after S110 is completed in a manufacturing method of a display panel according to an embodiment of the present disclosure.

As shown in FIG. 5, the light-emitting layer 2 may be manufactured by a vapor deposition and patterning process, but the embodiment of the present disclosure is not limited thereto. The light-emitting layer 2 may include a hole injection layer, a hole transport layer, an electron blocking layer, an organic electroluminescent layer, a hole blocking layer, an electron transport layer, an electron injection layer, but is not limited thereto, and the light-emitting layer 2 may further include a cathode, an optical coupling layer, or the like.

In S120, a blocking layer is formed on a surface of the light-emitting layer away from the display substrate, and an orthographic projection of the blocking layer on the display substrate covers the overall area of the opening region and at least a part of the isolation region.

Figure 6:
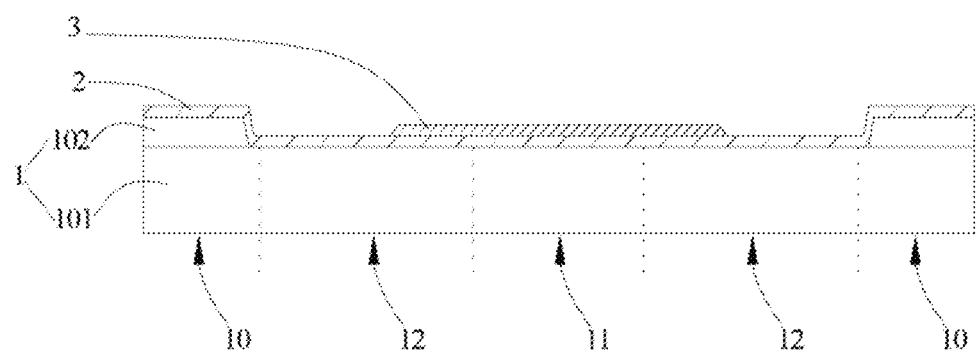
FIG. 6 is a schematic view after S120 is completed in a manufacturing method of a display panel according to an embodiment of the present disclosure.

As shown in FIG. 6, the blocking layer 3 may be formed by vapor deposition, but the embodiment of the present disclosure is not limited thereto. The orthographic projection of the blocking layer 3 on the display substrate 1 covers the overall area of the opening region 11, that is, an area of the opening region 11 is smaller than an area of the blocking layer 3. The orthographic projection of the blocking layer 3 on the display substrate 1 covers at least a part of the isolation region 12, that is, the area of the blocking layer 3 is smaller than or equal to a sum of areas of the opening region 11 and the isolation region 12. The blocking layer 3 may have a circular or square shape, and of course, may also have other shapes. A material of the blocking layer 3 may include an inorganic material, but the embodiments of the present disclosure are not limited thereto. The inorganic material may include a metallic material. The metallic material may comprise one or more of aluminum, titanium, tin, copper, chromium, zinc, and molybdenum. In other embodiments of the present disclosure, the inorganic material may include silicon nitride, aluminum oxide, or the like. The blocking layer 3 may have a thickness of 20-2000 nm, such as 20 nm, 130 nm, 460 nm, 550 nm, 1200 nm, 2000 nm, etc.

In S130, a first packaging layer that covers the light-emitting layer and the blocking layer is formed.

Figure 7:
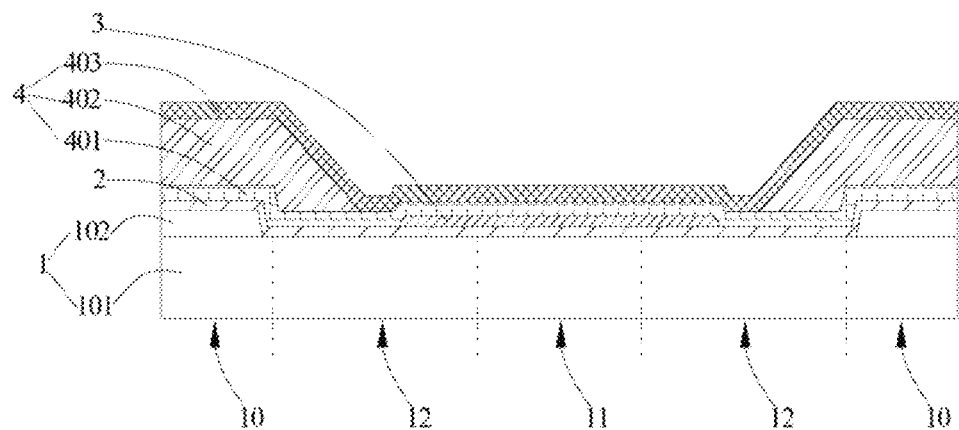
FIG. 7 is a schematic view after S130 is completed in a manufacturing method of a display panel according to an embodiment of the present disclosure.

As shown in FIG. 7, the first packaging layer 4 may be manufactured by vapor deposition and patterning process, however, the embodiment of the present disclosure is not limited thereto. The thickness of the first packaging layer 4 may be greater than the thickness of the blocking layer 3. The first packaging layer 4 may include a first inorganic packaging layer 401, a second inorganic packaging layer 403, and an organic packaging layer 402 between two inorganic packaging layers. A boundary of the organic packaging layer 402 is surrounded in boundaries of the first inorganic packaging layer 401 and the second inorganic packaging layer 403 to prevent moisture from permeating along the organic packaging layer 402 from a side edge thereof, thereby reducing the packaging effect.

In S140, a photoresist layer is formed, and the first packaging layer is patterned through the photoresist layer to form a first through hole on the first packaging layer, where an orthographic projection of the first through hole on the display substrate is within a region of an orthographic projection of the blocking layer on the display substrate.

Figure 8:
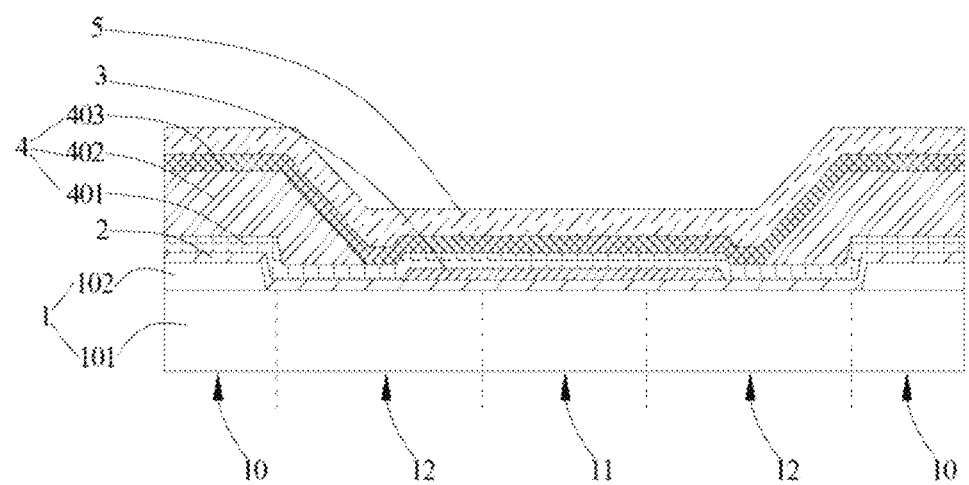
FIG. 8 is a schematic view of forming a photoresist layer on the structure shown in FIG. 6 according to an embodiment of the present disclosure.
Figure 9:
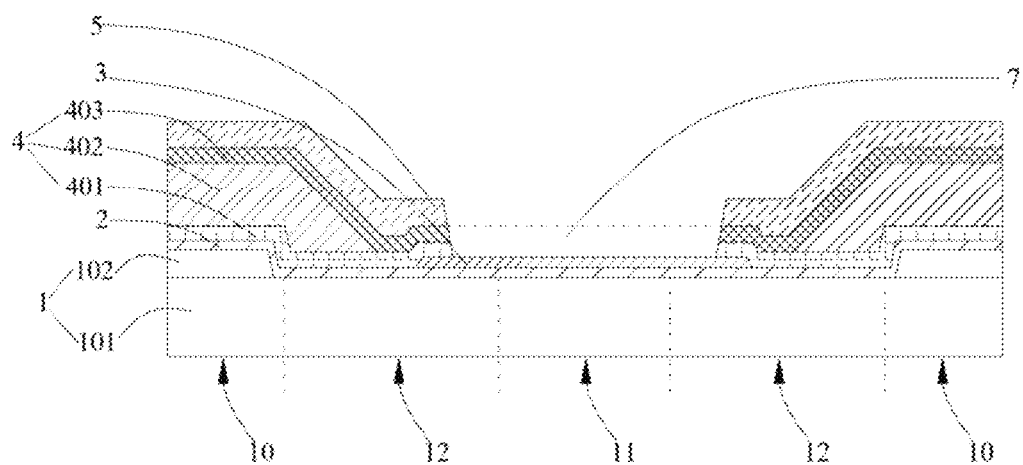
FIG. 9 is a schematic view after S140 is completed in a manufacturing method of a display panel according to an embodiment of the present disclosure.

As shown in FIG. 8 and FIG. 9, the photoresist layer 5 covers a side of the first packaging layer 4 away from the display substrate 1. The first through hole 7 may be a circular hole, and of course, may also be a rectangular hole, but the embodiment of the present disclosure is not limited thereto. The orthographic projection of the first through hole 7 on the display substrate 1 is within a region of the orthographic projection of the blocking layer 3 on the display substrate 1, that is, a cross-sectional area of the first through hole 7 is smaller than or equal to an area of the blocking layer 3. Further, the orthographic projection of the first through hole 7 on the display substrate 1 covers the overall area of the opening region 11 and at least a part of the isolation region 12.

In S150, the photoresist layer is removed by a stripper.

Figure 10:
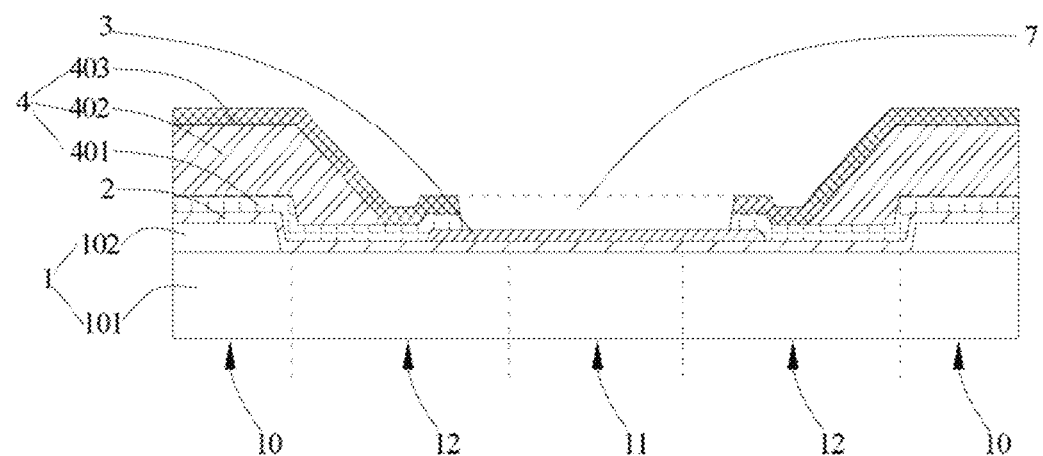
FIG. 10 is a schematic view after S150 is completed in a manufacturing method of a display panel according to an embodiment of the present disclosure.

As shown in FIG. 10, since the orthographic projection of the first through hole 7 on the display substrate 1 is within the region of the orthographic projection of the blocking layer 3 on the display substrate 1, the stripper can be prevented from contacting the light-emitting layer 2, to avoid an organic solvent in the stripper from dissolving substances in the light-emitting layer 2, and prevent moisture in the stripper from eroding the light-emitting layer 2.

In S160, a part of the blocking layer corresponding to the first through hole and a part of the light-emitting layer corresponding to the first through hole are removed to form a second through hole.

Figure 11:
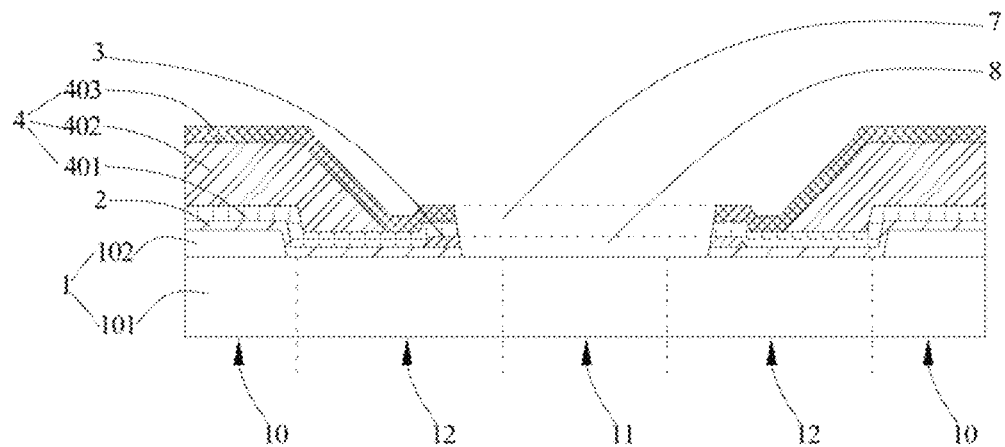
FIG. 11 is a schematic view after S160 is completed in a manufacturing method of a display panel according to an embodiment of the present disclosure.

As shown in FIG. 11, a part of the blocking layer 3 corresponding to the first through hole 7 and a part of the light-emitting layer 2 corresponding to the first through hole 7 are etched by an etching gas to form a second through hole 8. The etching gas may include one or more of chlorine, boron trichloride, and silicon tetrachloride, so that an etching rate of the blocking layer 3 made of a metallic material is greater than that of the first packaging layer 4. Since the orthographic projection of the first through hole 7 on the display substrate 1 covers the overall area of the opening region 11 and at least a part of the isolation region 12, the orthographic projection of the second through hole 8 on the display substrate 1 covers the overall area of the opening region 11 and at least a part of the isolation region 12.

Figure 2:
FIG. 2 is a flowchart of a manufacturing method of a display panel according to another embodiment of the present disclosure.

As shown in FIG. 2, in another embodiment, the manufacturing method of the display panel of the present disclosure may further include a step of:

S170, forming a second packaging layer covering the first packaging layer, where the second packaging layer covers an inner wall of the second through hole.

Figure 12:
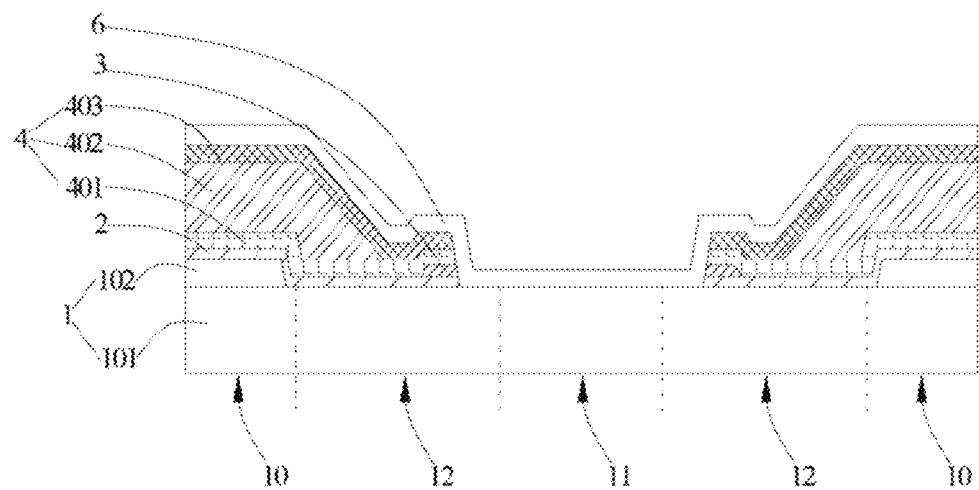
FIG. 12 is a schematic view after S170 is completed in a manufacturing method of a display panel according to an embodiment of the present disclosure.

As shown in FIG. 12, the second packaging layer 6 may be manufactured by vapor deposition, but the embodiment of the present disclosure is not limited thereto. The material of the second packaging layer 6 may be silicon nitride, and of course, may also be aluminum oxide, but the embodiment of the present disclosure is not limited thereto. Since the second packaging layer 6 covers the overall area of the inner wall of the second through hole 8, the second packaging layer 6 covers a boundary of the light-emitting layer 2.

The manufacturing method may further include a step of:

S180, forming openings in the opening region.

Figure 13:
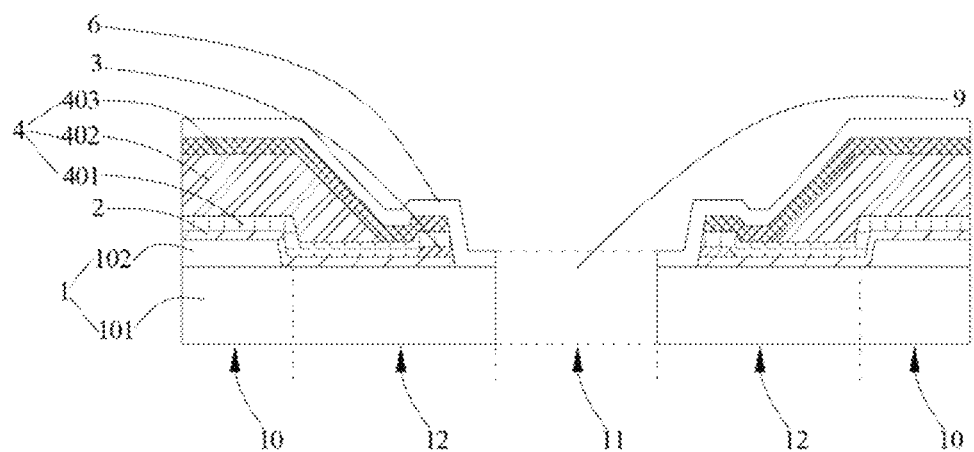
FIG. 13 is a schematic view after S180 is completed in a manufacturing method of a display panel according to an embodiment of the present disclosure.

As shown in FIG. 13, the second packaging layer 6 covers a boundary of the light-emitting layer 2 to prevent the light-emitting layer 2 from being exposed during an opening forming process, ensure the light-emitting layer 2 around the opening region 11 to be completely packaged, and prevent the light-emitting layer 2 from being eroded by water and oxygen. A mounting hole 9 formed after forming the opening may be a through hole, and of course, may also be a blind hole, but the embodiment of the present disclosure is not limited thereto.

An embodiment of the present disclosure also provides a display panel. The display panel may be manufactured by the manufacturing method of the display panel described in any of the above embodiments, having the same beneficial effects, which are not described herein again.

An embodiment of the present disclosure also provides a display device. The display device may include the display panel described in any of the above embodiments, having the same beneficial effects, which are not described herein again. Of course, the display device may also include components, such as an earphone, a camera, a sensor, etc., which are installed in the mounting hole. The display device may be a terminal equipment such as a mobile phone, a tablet computer, or the like.

Other embodiments of the disclosure will be apparent to those skilled in the art from consideration of the specification and practice of the disclosure disclosed herein. This application is intended to cover any variations, uses, or adaptations of the disclosure following, in general, the principles of the disclosure and including such departures from the present disclosure as come within known or customary practice in the art to which the disclosure pertains. It is intended that the specification and examples be considered as exemplary only, with a true scope and spirit of the disclosure being indicated by the following claims.

What is claimed is:

1. A display panel, comprising:
a display substrate comprising a display region, wherein an opening region and an isolation region surrounding the opening region are arranged within the display region;
a light-emitting layer formed on the display region;
a blocking layer formed on a surface of the light-emitting layer away from the display substrate; and
a first packaging layer covering the light-emitting layer and the blocking layer,
wherein the first packaging layer is patterned through a photoresist layer covering a side of the first packaging layer away from the display substrate to form a first through hole on the first packaging layer;
a second through hole is respectively formed at a part of the blocking layer corresponding to the first through hole and at a part of the light-emitting layer corresponding to the first through hole;
wherein the light-emitting layer covers an overall area of the display region,
wherein an overall area of the opening region and at least a part of the isolation region are surrounded by an outline of an orthographic projection of the blocking layer on the display substrate, and
wherein an orthographic projection of the first through hole on the display substrate is surrounded by an outline of the orthographic projection of the blocking layer on the display substrate, and an orthographic projection of the first through hole on the display substrate covers the overall area of the opening region and at least a part of the isolation region.

2. The display panel of claim 1, wherein a material of the blocking layer comprises an inorganic material.

3. The display panel of claim 2, wherein the inorganic material comprises a metallic material.

4. The display panel of claim 3, wherein the metallic material comprises at least one of: aluminum, titanium, tin, copper, chromium, zinc, and molybdenum.

5. The display panel of claim 3, wherein the part of the blocking layer corresponding to the first through hole and the part of the light-emitting layer corresponding to the first through hole are etched using an etching gas to form the second through hole, wherein the etching gas comprises at least one of: chlorine, boron trichloride, and silicon tetrachloride.

6. The display panel of claim 1, further comprising a second packaging layer covering the first packaging layer and covering an inner wall of the second through hole, wherein an opening is formed in the opening region.

7. The display panel of claim 1, wherein a thickness of the blocking layer is less than a thickness of the first packaging layer.

8. The display panel of claim 1, wherein a thickness of the blocking layer is 20 nm 2000 nm.

9. A display device comprising a display panel, wherein the display panel comprises:
a display substrate comprising a display region, within which an opening region and an isolation region surrounding the opening region are arranged;
a light-emitting layer formed on the display region;
a blocking layer formed on a surface of the light-emitting layer away from the display substrate; and
a first packaging layer covering the light-emitting layer and the blocking layer,
wherein the first packaging layer is patterned through a photoresist layer covering a side of the first packaging layer away from the display substrate to form a first through hole on the first packaging layer;

a second through hole is respectively formed at a part of the blocking layer corresponding to the first through hole and a part of the light-emitting layer corresponding to the first through hole;

wherein the light-emitting layer covers an overall area of the display region, wherein an overall area of the opening region and at least a part of the isolation region are surrounded by an outline of an orthographic projection of the blocking layer on the display substrate, and wherein an orthographic projection of the first through hole on the display substrate is surrounded by an outline of the orthographic projection of the blocking layer on the display substrate, and an orthographic projection of the first through hole on the display substrate covers the overall area of the opening region and at least a part of the isolation region.

10. The display device of claim 9, wherein the display panel comprises a second packaging layer covering the first packaging layer and covering an inner wall of the second through hole, and an opening is formed in the opening region.

11. The display device of claim 9, wherein a thickness of the blocking layer is less than a thickness of the first packaging layer.

\* \* \* \* \*

UNITED STATES PATENT AND TRADEMARK OFFICE
CERTIFICATE OF CORRECTION

| | | |
|---|---|---|
| PATENT NO. | : 11,910,693 B2 | Page 1 of 1 |
| APPLICATION NO. | : 17/871067 | |
| DATED | : February 20, 2024 | |
| INVENTOR(S) | : Ziyu Zhang et al. | |

It is certified that error appears in the above-identified patent and that said Letters Patent is hereby corrected as shown below:

On the Title Page

Item (54) and in the Specification, Column 1, Lines 1-5, The Title should appear as follows:
-- DISPLAY PANEL, DISPLAY DEVICE AND MANUFACTURING METHOD THEREOF COMPRISING PATTERNING LIGHT-EMITTING LAYER IN OPENING REGION --.

Signed and Sealed this
Thirteenth Day of January, 2026

John A. Squires
*Director of the United States Patent and Trademark Office*